United States Patent
Yamaguchi et al.

(10) Patent No.: US 6,871,775 B2
(45) Date of Patent: Mar. 29, 2005

(54) PROCESS FOR SOLDERING AND CONNECTING STRUCTURE

(75) Inventors: Atsushi Yamaguchi, Minoo (JP); Masato Hirano, Toyonaka (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 34 days.

(21) Appl. No.: 10/325,888

(22) Filed: Dec. 23, 2002

(65) Prior Publication Data

US 2003/0121959 A1 Jul. 3, 2003

(30) Foreign Application Priority Data

Dec. 28, 2001 (JP) ........................................ 2001-400721

(51) Int. Cl.[7] .............................................. B23K 31/02
(52) U.S. Cl. ........................................ 228/215; 228/256
(58) Field of Search ................. 228/215, 179.1–180.22, 228/245.262

(56) References Cited

U.S. PATENT DOCUMENTS

| | | | | |
|---|---|---|---|---|
| 4,643,347 A | * | 2/1987 | Bronnes et al. | 228/208 |
| 5,476,211 A | * | 12/1995 | Khandros | 228/180.5 |
| 5,817,188 A | * | 10/1998 | Yahatz et al. | 136/237 |
| 6,049,976 A | * | 4/2000 | Khandros | 29/843 |
| 6,083,770 A | * | 7/2000 | Sato et al. | 438/54 |
| 6,334,570 B1 | | 1/2002 | Koshi et al. | |
| 6,492,585 B1 | * | 12/2002 | Zamboni et al. | 136/201 |
| 6,548,898 B2 | * | 4/2003 | Matsuki et al. | 257/746 |
| 6,569,752 B1 | * | 5/2003 | Homma et al. | 438/597 |
| 6,689,639 B2 | * | 2/2004 | Sakuyama et al. | 438/118 |
| 2001/0020545 A1 | * | 9/2001 | Eldridge et al. | 174/260 |
| 2001/0020546 A1 | * | 9/2001 | Eldridge et al. | 174/261 |
| 2002/0023773 A1 | * | 2/2002 | Khandros | 174/250 |
| 2002/0117330 A1 | * | 8/2002 | Eldridge et al. | 174/260 |
| 2002/0121709 A1 | * | 9/2002 | Matsuki et al. | 257/786 |
| 2003/0022477 A1 | * | 1/2003 | Hsieh et al. | 438/612 |
| 2003/0062398 A1 | * | 4/2003 | Khandros | 228/112.1 |
| 2003/0116845 A1 | * | 6/2003 | Bojkov et al. | 257/738 |
| 2003/0120959 A1 | * | 6/2003 | Bohrer et al. | 713/320 |
| 2003/0121954 A1 | * | 7/2003 | Yamaguchi | 228/208 |
| 2003/0151141 A1 | * | 8/2003 | Matsuki et al. | 257/746 |
| 2003/0155408 A1 | * | 8/2003 | Fanti et al. | 228/215 |
| 2004/0067604 A1 | * | 4/2004 | Ouellet et al. | 438/108 |
| 2004/0084206 A1 | * | 5/2004 | Tung | 174/255 |

FOREIGN PATENT DOCUMENTS

| | | |
|---|---|---|
| EP | 0 804 058 | 10/1997 |
| JP | 10-41621 | 2/1998 |
| JP | 2001-44615 | 2/2001 |
| JP | 2001-237272 | 8/2001 |
| JP | 2001-284785 | 10/2001 |
| JP | 2002-185131 | 6/2002 |
| JP | 02003198117 A * | 7/2003 |

* cited by examiner

*Primary Examiner*—Kiley S. Stoner
(74) *Attorney, Agent, or Firm*—Wenderoth, Lind & Ponack, L.L.P.

(57) ABSTRACT

A barrier metal layer is provided on at least one of two electrodes, with one formed on a substrate and the other connected to an electronic component, so as to coat a base material of the electrode, which base material is made of a material containing Cu. Soldering between the electrode of the electronic component and the electrode on the substrate is conducted by supplying a solder material containing Sn and Bi, contacting the solder material with the barrier metal layer while the solder material is in a molten state; and solidifying the solder material. Thereby, when the electronic component is soldered to the substrate with the solder material such as an Sn—Bi based material or an Sb—Ag based material containing Bi, the degradation of a soldering part is avoided, and thus a sufficient thermal fatigue strength of the soldering part is obtained.

19 Claims, 5 Drawing Sheets

← Solder Phase

← Ni Phase

← Solder Phase

← Ni Phase

← Solder Phase

← Cu-Sn Intermetallic Compound

← Cu Phase

← Solder Phase

← Cu-Sn Intermetallic Compound

← Cu Phase

PROCESS FOR SOLDERING AND CONNECTING STRUCTURE

CROSS-REFERENCE TO RELATED APPLICATIONS

The present application claims a priority under 35 U.S.C. §119 to Japanese Patent Application No. 2001-400721 filed on Dec. 28, 2001, entitled "PROCESS FOR SOLDERING AND CONNECTING STRUCTURE". The contents of that application are incorporated herein by the reference thereto in their entirety.

BACKGROUND OF THE INVENTION

1. Field of the Invention

The present invention relates to a process for soldering a member to another member. More specifically, the present invention relates to a process for soldering a land formed on a substrate to an electrode (e.g. a lead) of an electronic component in the production of an electronic circuit board. Furthermore, the present invention also relates to a connecting structure, more specifically an electronic circuit board, produced by such process for soldering.

2. Description of Related Art in the production of an electronic circuit board to be used for an electronic device and so on, a reflow soldering process is known as a process for mounting an electronic component on a substrate, more specifically, for physically connecting a lead taken out from the electronic component, to a land formed on the substrate.

In a general reflow soldering process, a so-called cream solder is applied by screen printing onto a land that is a part of a patterned wiring formed on a substrate. The cream solder is usually a mixture of soldering powder of a solder material, and a flux including rosin, an activator and a solvent. After that, an electronic component is located on a predetermined portion of the substrate so that a lead taken out from the electronic component adheres to the cream solder applied on the land. The thus-obtained substrate, on which the electronic component is located through the cream solder, is heated at a temperature of at least the melting point of the used solder material so as to activate the flux and melt solder material of the soldering powder in the cream solder, and to evaporate (or volatilize) off other components such as the flux in the cream solder. Thereafter, the resultant product is cooled (or subjected to radiational cooling) such that the molten solder material is solidified. The solidified solder material forms a connecting part between the lead of the electronic component and the land of the substrate to electrically and physically connect them to each other. Although other component(s) such as the flux other than the solder material may be present in the connecting part, such other component is excluded by phase separation form the solder material during the heating. Therefore such component is not present inside the connecting part and only remains in a small amount on the surface of the connecting part. Thereby, an electronic circuit board is obtained, wherein the electronic component is mounted on the substrate by the connecting part (or the soldering part) which is substantially composed of the solder material.

As the solder material, an Sn—Pb based material, in particular an Sn—Pb based material having an eutectic composition (hereinafter simply referred to as an Sn—Pb eutectic material also) is generally used. The eutectic composition of the Sn—Pb based material is an Sn-37Pb composition (i.e. a composition consisting of 37% by weight of Pb and the rest (63% by weight) of Sn). It is known that the Sn—Pb based material has a melting point of 183° C. in the case of this eutectic composition.

Recently, a manner of disposing an electronic device including the electronic circuit board described above becomes an issue, and this causes a concern about influence on the global environment or human bodies due to lead (Pb) contained in the conventional solder material. For that reason, there is a movement for using a solder material containing no lead, namely a lead-free solder material, in place of the conventionally used Sn—Pb based material, and efforts have been made to put the lead-free solder material into practical use.

At present, materials having various compositions have been suggested as the lead-free solder material. One of them is an Sn—Bi based material. As a result of recent studies, the eutectic composition of the Sn—Bi based material is roughly an Sn-58Bi composition (i.e. a composition consisting of 58% by weight of Bi and the rest (42% by weight) of Sn). It has turned out that the Sn—Bi based material has a melting point of 139° C. in the case of this eutectic composition.

Considering the thermal resistance of the electronic component to be mounted on the substrate as well as the guaranteed temperature range of a product provided with the electronic circuit board, the lead-free solder material desirably has a melting point that is sufficiently low so as not to damage the electronic component, and is higher than the guaranteed temperature range for thermal resistance of the product. The melting point of the Sn—Bi based material as above is lower than the melting point of other lead-free solder material such as an Sn—Ag based material and even that of the conventional Sn—Pb based material, and higher than the guaranteed upper limit temperature for thermal resistance of a product. Therefore, the Sn—Bi based material has an advantage in that it becomes possible to conduct soldering at a low temperature. Accordingly, the Sn—Bi based material can be regarded as a strong candidate for a substitute for the Sn—Pb based material.

The eutectic composition of an Sn—Ag based material, which has similarly been suggested as the lead-free solder material, is a roughly Sn-3.5Ag composition (i.e., a composition consisting of 3.5% by weight of Ag and the rest (96.5% by weight) of Sn). It has also turned out that the Sn—Ag based material has a melting point of 221° C. in the case of this eutectic composition. From the viewpoints of the thermal resistance of the electronic component to be mounted on the substrate, and of the adaptability for the existing soldering process, the lead-free solder material desirably has a melting point which is sufficiently low so as not to damage the electronic component and which is relatively close to the melting point of the conventional Sn—Pb based material. However, since the Sn—Ag based material has a melting point higher than that of the conventional Sn—Pb based material and therefore it is difficult to adopt the Sn—Ag based material for the existing soldering process as it is.

However, it has also turned out that, by adding Bi to the Sn—Ag based material to prepare an Sn—Ag—Bi based material, the melting point thereof is made lower and closer to the melting point of the conventional Sn—Pb based material. For example, the Sn—Ag—Bi based material has a melting point of 210° C. in the case of an Sn-3Ag-3Bi-3In composition (i.e. a composition consisting of 3% by weight of Ag, 3% by weight of Bi, 3% by weight of In and the rest (91% by weight) of Sn). For this reason, the Sn—Ag—Bi based material can also be regarded as another strong candidate for a substitute for the Sn—Pb based material.

By using the Sn—Bi based material or the Sn—Ag—Bi based material in place of the Sn—Pb based material, there is an advantage in that soldering of an electronic component to a circuit board can be conducted while avoiding thermal damage to the electronic component. However, from a result of a test for continuous use of the electronic circuit board obtained thereby under a high temperature condition, the inventors found that a connecting part between the land of the substrate and the lead of the electronic component degraded and a sufficiently high thermal fatigue strength could not be obtained.

It is considered that such degradation (or deterioration) results from following mechanism. Tin (Sn) contained in the Sn—Bi based material or the Sn—Ag—Bi based material contacts copper (Cu) used for a material of the land and the lead. Then, an intermetallic compound of Sn—Cu is formed at (or in the vicinity of) interfaces between the connecting part and the land and between the connecting part and the lead. As a result, the concentration of bismuth (Bi) at the interfaces becomes relatively high.

More detail explanation hereinafter will be made with reference to FIG. 5, as to an electronic circuit board 80 which is produced by soldering an electronic component to a substrate while using a cream solder containing soldering powder of the Sn—Bi based material in place of the Sn—Pb material in the conventional reflow soldering process as described above.

In this electronic circuit board 80, a lead 69 taken out from an electronic component 67 is electrically and mechanically connected to a land 63 formed on a substrate 61 through a connecting part 65. The land 63 is generally made of Cu and is formed integrally with a patterned wiring. The lead 69 is generally composed of a base material 69a of Cu and a plating 69b of an Sn—Pb eutectic material which coats the base material 69a. The connecting part 65 results from the cream solder by a heat treatment, and it is substantially made of a solder material derived from the soldering powder as mentioned above.

During the heat treatment, Cu consisting in the land 63 diffuses into the solder material to be combined with Sn since the solder material is directly contacted with the land 63. As a result, an intermetallic compound 73 of Sn—Cu is formed at (or in the vicinity of) an interface of the contact between the connecting part 65 and the land 63.

Further, during the heat treatment, the solder material of the soldering powder melts, and the plating 69b of the Sn—Pb eutectic material also melt since the melting point of the Sn—Pb eutectic material is generally lower than the temperature of the heat treatment. A part of the plating 69b which part is contacted with the molten solder material, melts and diffuses into the solder material. For this reason, the plating 69b of the lead 69 is partially removed off, so that the base material 69a comes to be in direct contact with the molten solder material. Therefore, Cu consisting in the base material 69a of the lead 69 diffuses into the solder material to be combined with Sn similarly to the above. An intermetallic compound 71 of Sn—Cu is formed at an interface of the contact between the connecting part 65 and the lead 69.

Since the intermetallic compound 71 of Sn—Cu is formed at the interfaces in this manner, the concentration of Bi relatively increases at local regions surrounding the intermetallic compound which exists in the interfaces. As a result, a phase 75 in which Bi is present at a relatively high concentration is formed (hereinafter which phase simply referred to as a concentrated Bi phase). Particularly in the case where the substrate to which the electronic component has been soldered is located under a high temperature for a long period, more amount of Cu diffuses into the connecting part (or the solder material), so that the formation of the intermetallic compound of Sn—Cu is proceeded, and the concentrated Bi phase 75 is consequently enlarged (or grown). It is considered that the concentrated Bi phase 75 causes degradation of the connecting part since the concentrated Bi phase 75 is so weak.

Especially in a case where the electronic component is plated with the Sn—Pb material such as the Sn—Pb eutectic material, the degradation of the connecting part was remarkably caused. It is considered that such degradation results from the following mechanism. Once the concentrated Bi phase 75 is formed at the interfaces between the connecting part 65 and the lead 69 and/or between the connecting part 65 and the land 63, an alloy of Sn—Bi—Pb is likely to be formed since lead (Pb) contained in the plating material for the lead is readily combined with bismuth (Bi). Such Sn—Bi—Pb alloy has a low melting point of about 98° C. In the case where the substrate is placed under a high temperature for a long period, the Sn—Bi—Pb alloy formed in the connecting part melts. Once the molten Sn—Bi—Pb alloy is formed, growth of the alloy phase is promoted. As a result, it is considered that the degradation of the connecting part has occurred.

At present, the movement away form lead (Pb) has also been advanced as to a plating material of a lead of an electronic component. In the current situation during a transitional period, however, there is a case where the Sn—Pb based material is still used. Such a case cannot be disregarded, either.

Additionally, an intermetallic compound of Sn—Cu may be formed at interfaces between the connecting part and the land and/or between the connecting part and the lead also in a conventional case as in the prior art where the cream solder containing soldering powder of the Sn—Pb based material is used, since copper (Cu) as a material of the land and/or the lead diffuses into the connecting part and combines with tin (Sn) contained in the Sn—Pb based material. However, the intermetallic compound of Sn—Cu is stable. Furthermore, Bi is not present at the connecting part in such case. Therefore, even though the intermetallic compound of Sn—Cu is formed, a concentrated Bi phase is not formed and thus an Sn—Bi—Pb alloy is not formed. It is considered that the problem of the degradation in the connecting part did not occur in such conventional case.

There is a case where the base material 69a of the lead 69 is not made of Cu, but made of another material such as an Fe-42Ni alloy material (i.e. an alloy material consisting of 42% by weight of Ni and the rest (58% by weight) of Fe). In this case, even if the plating 69b of the lead 69 melts and diffuses into the solder material to contact with the base material 69a directly, the intermetallic compound 71 of Sn—Cu is not formed at the interface of the lead 69 and the connecting part 65. On the other hand, the intermetallic compound 73 of Sn—Cu is again formed at the interface of the land 63 of Cu and the connecting part 65, so that it brings about the enlargement of the concentrated Bi phase and, in cases where the plating material contains Pb, the formation of an Sn—Bi—Pb alloy. Thus, when the resultant electronic circuit board is subjected to a test for continuous use under a high temperature condition, the degradation of the connecting part occurs. It is not possible also in this case to avoid the problem of an insufficient thermal fatigue strength.

The problems mentioned above arise by subjecting the connecting part to a heat treatment for a long period. Therefore, problems similar to those that arise in the test mentioned above would also arise in a case where a heat treatment is performed twice or more, for example, in a production of a so-called "double sided-reflow soldered substrate" or a so-called "double sided-flow soldered and reflow soldered substrate" as the electronic circuit board. The former substrate is produced by conducting a reflow soldering on one side of a substrate to connect an electronic component to the substrate, and by conducting a reflow soldering on the other side of the substrate to connect an electronic component to the substrate. The latter substrate is produced by conducting a flow soldering on one side of a substrate to connect an electronic component to the substrate, and by conducting a reflow soldering on the other side of the substrate to connect an electronic component to the substrate.

As described above, the cases of using the Sn—Bi based material were explained, and similar problems may also occur on using other solder materials at least containing Sn and Bi, such as the Sn—Ag—Bi based material.

SUMMARY OF THE INVENTION

The present invention aims to provide a soldering process which can effectively prevent the degradation of a soldering part (or a connecting part) after a continuous use under a high temperature condition so as to attain a sufficiently high thermal fatigue strength. Such degradation is caused through the mechanism which is peculiar to the cases where an electronic component is soldered (or connected) to a circuit board using a solder material containing Sn and Bi, such as an Sn—Bi based material or an Sn—Ag—Bi based material. The present invention also aims to provide an electric circuit board produced by such soldering process.

The inventors approach the problems described above in two ways. One approach is to prevent the formation of the intermetallic compound of Sn—Cu which causes the enlargement of the concentrated Bi phase. The other approach is to suppress the progress of the formation of the intermetallic compound of Sn—Cu and the following enlargement of the concentrated Bi phase.

According to one aspect of the present invention, in the process for soldering a first member to a second member with the solder material containing Sn and Bi, at least one of the first and second members includes a base material containing Cu and provided with a barrier metal layer for coating the base material, and the solder material in a molten state is contacted with the barrier metal layer and is solidified, whereby the first member is soldered (or connected) to the second member.

According to the soldering process as above, Sn in the solder material is not directly contacted with Cu contained in the base material due to the barrier metal layer, whereby the formation of the intermetallic compound of Sn—Cu, and thus the enlargement of the concentrated Bi phase can effectively be suppressed or prevented. Therefore, causes for the degradation of the connecting part after a continuous use under a high temperature condition, and furthermore for the degradation of the thermal fatigue strength can be reduced or eliminated.

Furthermore, according to the present invention, there is provided a connecting structure formed by soldering the first member to the second member with the solder material containing Sn and Bi, wherein at least one of the first and second members includes the base material containing Cu and the barrier metal layer for coating the base material. The connecting structure can attain the similar effects as above.

Alternatively, according to another aspect of the present invention, there is provided a soldering process wherein, in place of providing the barrier metal layer in the soldering process of the present invention described above, the solder material in a molten state is cooled at the cooling rate of at least 10° C./sec to be solidified. Further, there is also provided a connecting structure obtained thereby. According to this soldering process, the formation of the concentrated Bi phase can effectively be suppressed or prevented. Thus, causes for the degradation of the connecting part after a continuous use under a high temperature condition, and furthermore for the degradation of the thermal fatigue strength can be reduced or eliminated.

Hereinafter, the present invention will be described in more detail.

According to one aspect of the present invention, there is provided a process for soldering (or connecting) a first member to a second member with a solder material containing Sn and Bi, such as an Sn—Bi based material or an Sn—Ag—Bi based material, which process comprises: supplying (or placing) the solder material between the first and second members, wherein at least one of the first and second members has a base material (or a parent material) containing Cu and a barrier metal layer for coating the base material; contacting the solder material in a molten state with the barrier metal layer; and solidifying the molten solder material, whereby the first member is soldered to the second member.

According to the soldering process as described above, the base material containing Cu is coated with the barrier metal layer, and the solder material containing Sn is contacted with the barrier metal layer. Thus, a direct contact of Sn in the solder material with Cu contained in the base material can be avoided, so that the formation of an intermetallic compound of Sn—Cu can be suppressed or prevented effectively. Therefore, an enlargement of a concentrated Bi phase does not occur, and preferably the formation of the concentrated Bi phase is substantially prevented. As a result, it is possible to reduce or eliminate the degradation of the soldering part (also referred to as the connecting part in the present specification) and thus the decrease in a thermal fatigue strength, after a continuous use under a high temperature condition.

According to another aspect of the present invention, there is also provided a method for improving a thermal fatigue strength of a soldering part formed by a process which comprises: supplying (or placing) a solder material comprising Sn and Bi between a first member and a second member, at least one of the first and second members having a portion comprising Cu; contacting the solder material in a molten state with the first and second members; and solidifying the molten solder material to form a soldering part of the solder material between the first and second members, wherein the method comprises providing a barrier metal layer for coating that portion as a base material, and contacting the solder material in a molten state with the barrier metal layer, whereby the thermal fatigue strength of the soldering part is improved.

In a case where both of the first and second members are made of the material containing Cu, and therefore Cu can diffuse into the solder material (or the connecting part) from both members, the material containing Cu is preferably coated with the barrier metal layer in both of these members so that the material containing Cu is not directly contacted with the solder material. Thereby, the formation of the intermetallic compound of Sn—Cu can be prevented. However, the present invention is not necessarily limited to this. Even in such case as above, the decrease in the thermal fatigue resistance can be alleviated by providing any one of the first and second members with the barrier metal layer, in comparison with a case where no barrier metal layer is provided.

For example, one of the first and second members may not be provided with the barrier metal layer on a surface thereof, and the surface may consist of a material containing lead (Pb) which can melt and diffuse into the solder material (or the connecting part). Even in such case, a portion containing Cu in the other member is coated as a base material with the barrier metal layer according to the present invention. Therefore, the formation of the intermetallic compound of Sn—Cu is prevented at least at the interface between the barrier metal layer and the connecting part. Accordingly, the decrease in the thermal fatigue resistance can be alleviated compared with the case where no barrier metal layer is provided. Of course, in the member provided with no barrier metal layer, a portion which is to be contacted with the solder material after the material containing lead (Pb) has melted does not preferably contain Cu. Thereby, the formation of the intermetallic compound of Sn—Cu can be prevented also at the interface between this member and the connecting part In the present invention, it is necessary that the barrier metal layer coats the base material such that the base material containing Cu does not substantially contacts the solder material in a molten state, although the barrier metal layer may be composed of either of a single layer or a multilayer laminate. A material for the barrier metal layer preferably does not substantially diffuse (or dissolve) into the molten solder material, or diffuses into it at a little amount enough to avoid substantially contacting the base material which contains Cu and located under the base material, with the solder material by exposing the base material to the solder material. In the present specification, an exposed surface side to be contacted with the solder material is set "above" with reference to the base material of the member to be soldered, while a base material side is set "under" on the same reference.

Further, the barrier metal layer is preferably composed of a conductive material so as to secure an electrical conduction between the first member and the second member. For example, the barrier metal layer can be a metallic layer or a multilayer laminate thereof.

In a preferred embodiment of the present invention, the barrier metal layer can be an Ni layer (i.e. a layer made of Ni, other layers mentioned below will be expressed in the same manner) or a multilayer laminate including an Ni layer. It is suitable to use Ni as a material for the barrier metal layer, since Ni hardly diffuses into the solder material while contacts the solder material, and thus does not expose the base material located under the Ni layer as the barrier metal layer (thus, Cu contained in the base material does not elute into the solder material). The Ni layer is preferably directly contacted with the base material containing Cu so as to coat the base material. However, the present invention is not limited to this, and a layer composed of other conductive material may be provided between the Ni layer and the base material.

In a case where a multilayer laminate including an Ni layer is used as the barrier metal layer, at least one layer selected from the group consisting of an Au layer, a Pd layer and an Sn—Bi layer can be provided above the Ni layer. The Ni layer is readily oxidized in air. Due to its oxide, a wettability of the Ni layer to the solder material is comparatively poor. On the other hand, the layers described above such as the Au layer, are hardly oxidized compared with the Ni layer, and they thus have a good wettability to the solder material. For example, the barrier metal layer can consist of an Ni/Au layers, an Ni/Pd layers, an Ni/Pd/Au layers, an Ni/Sn—Bi layers or the like. By providing such layer to form the surface of the barrier metal layer above the Ni layer, the wettability to the solder material can be improved, and thus a connection reliability at the connecting part (mainly a connection strength) can be improved compared with a case where the Ni layer is used alone. In particular, the surface (or the top layer) of the barrier metal layer is preferably formed by an Au layer.

The layer constituting the barrier metal layer (if the barrier metal layer is in the form of a multilayer laminate, at least one layer thereof) can be formed by, for example, an electroplating method, a hot-dip plating method, a displacement plating method, or a deposition method, which are known in the art.

According to another aspect of the present invention, there is provided a connecting structure formed by soldering the first member to the second member with the solder material containing Sn and Bi, wherein at least one of the first member and the second member includes the base material containing Cu and the barrier metal layer for coating the base material.

In such connecting structure, since the base material containing Cu is coated with the barrier metal layer, the formation of an intermetallic compound of Sn—Cu, and thus the enlargement of a concentrated Bi phase can be suppressed or prevented effectively in the same manner as in the soldering process of the present invention as mentioned above. Thereby, it is possible to avoid causing the degradation of the connecting part, and thus to maintain a high thermal fatigue strength, after the connecting structure of the present invention is subjected to a continuous use under a high temperature condition.

Such connecting structure can be obtained by the soldering process of the present invention as mentioned above. Further, also in the connecting structure of the present invention, a barrier metal layer as mentioned above with regard to the soldering process of the present invention can be used. In a case where the barrier metal layer is composed of the Ni layer alone, the Ni layer remains as the barrier metal layer in the connecting structure obtained by the soldering process of the present invention. However, in a case where the barrier metal layer is composed of the Ni layer and, for example, the Au layer located above the Ni layer, Au in the Au layer elutes (or melts and diffuses) into the solder material by contacting the Au layer with the molten solder material, and therefore the Au layer is not recognized as one layer constituting the barrier metal layer. The Pd layer and the Sn—Bi layer are the same as in the Au layer.

In the soldering process, the method for improving the thermal fatigue strength of the soldering part (or the connecting part) and the connecting structure of the present invention, at least one of the first member and the second member to be soldered includes a portion containing Cu, and the portion as the base material is coated with the barrier metal layer. For example, in a case where one of the first member and the second member has the portion containing Cu, and the other has no portion containing Cu, said one portion containing Cu is coated (as a base material) with the barrier metal layer. For example, in a case where both of the first member and the second member have a portion containing Cu, at least one of said portions, preferably both the portions are coated (as base materials) with the barrier metal layer.

In the present invention, a set of the first and the second members can be a combination of a substrate and an electronic component, more specifically a combination of an electrode formed on a substrate and an electrode of an electronic component.

The above substrate includes, for example, those of a paper phenol material, a glass epoxy material, a polyimide film material, a ceramic material, a metallic material or the like. The electrode to be formed on such substrate can be, for example, a land formed integrally with a patterned wiring. This electrode can be formed by coating the base material of, for example, Cu with the barrier metal layer.

The electronic component as mentioned above includes, for example, a semiconductor component (such as a so-called QFP (quad flat package) component, a CSP (chip scale package) component, an SOP (single outside package) component), a chip component (such as a resistor, a capacitor, a transistor, and an inductor), a connector and the like. The electrode of such electronic component can be, for example, a lead or a terminal taken out from (or connected to) an electronic component. This electrode can be formed by coating the base material of, for example, Cu with the barrier metal layer.

However, the present invention is not limited to this. The first and second members can be various members which are to be soldered to each other. Thus, according to yet another aspect of the present invention, there is also provided the electrical component or an electronic component which is soldered with the solder material containing Sn and Bi, said electrical or electronic component having the electrode including the base material containing Cu and the barrier metal layer for coating the base material.

In the present specification, the solder material means a metal material having a relatively low melting point, e.g., a metal material which melts at a temperature in the range of about 100–250° C. The solder material containing Sn and Bi means a material containing at least Sn and Bi among such solder materials. For example, the solder material containing Sn and Bi can be an Sn—Bi based material, or an Sn—Ag based material to which Bi has been added (the latter of which is also referred to as an Sn—Ag—Bi based material in the present specification, and can include an Sn—Ag—Bi material, an Sn—Ag—Bi—In material and an Sn—Ag—Bi—Cu material). Further, the term "-based material" means a material based on the eutectic composition composed of designated metal elements and may contain a small amount of other metal element(s). The Sn—Bi based material, for example, is based on the Sn-58Bi eutectic composition and may or may not contain a small amount of other metallic element(s) (which is intentionally or unavoidably added thereto). The Sn—Bi based material can have a melting point of about 130–150° C., for example. The Sn—Ag based material to which Bi has been added, is based on the Sn-3.5Ag eutectic composition and contains a predetermined amount of Bi (for example, not more than 5% by weight on the basis of the total amount) and furthermore may or may not contain a small amount of other metallic element(s) (which is intentionally or unavoidably added thereto). The Sn—Ag material to which Bi has been added, can have a melting point in the range of about 200–220° C.

In the present invention, as readily understood by those skilled in the art, the soldering process can be conducted in a manner of either a reflow soldering process or a flow soldering process, on either or both sides of the substrate, and the connecting structure of the present invention is obtained by any one of these processes.

The concept of preventing the contact between Sn and Cu by the barrier metal layer in the present invention can be suitably adopted to a case where it is demanded to solve the possible problems associated with the formation of a concentrated Bi phase which results from the formation of an intermetallic compound of Sn—Cu under a condition where Sn and Cu coexist in a system including Bi.

Alternatively, in the soldering process of the present invention, the object of the present invention can be also achieved, in place of by providing the barrier metal layer, by cooling the solder material in a molten state, which has been supplied between the first member and the second member, at a cooling rate of at least 10° C./sec to solidify it. According to another aspect of the present invention, there are also provided a soldering process as above and a connecting structure obtained by this soldering process.

In the conventional soldering process, the cooling rate is less than 10° C./sec, generally from about 5° C./sec to less than 10° C./sec, and the substrate (more specifically the solder material) was not positively cooled after supplying the solder material thereto. On the other hand, according to the above process of the present invention, the cooling rate is larger than that of the conventional process. Therefore, even if a concentrated Bi phase is formed, the concentrated Bi phase can be dispersed into microphases by a rapid cooling and solidification. That is, an enlargement of the concentrated Bi phase can be effectively suppressed. Accordingly, it becomes possible to eliminate causes for the degradation of the soldering part (in the present specification, also referred to as the connecting part) after a continuous use under a high temperature condition, and furthermore for the decrease in the thermal fatigue strength Thus, according to another aspect of the present invention, there is also provided method for improving a thermal fatigue strength of a soldering part formed by a process which includes supplying (or placing) a solder material comprising Sn and Bi between a first member and a second member; contacting the solder material with the first member and the second member while the solder material is in a molten state, and solidifying the solder material to form a soldering part of the solder material between the first member and the second member, wherein the method includes cooling the solder material in a molten state at a cooling rate of at least 10° C./sec to solidify the solder material, whereby the thermal fatigue strength of the soldering part is improved.

Although the cooling rate of at least 10° C./sec can improve the thermal fatigue strength compared with that attained by the conventional soldering process, the cooling rate is preferably high, for example, at least about 20° C./sec, more specifically about 20–30° C./sec. By the cooling rate as above, the thermal fatigue strength can be improved more effectively compared with that attained by the conventional soldering process.

In the present invention, the cooling rate is defined as follows. A temperature profile of a land (or the soldering part) to be supplied with the solder material is measured with time by means of, for example, a thermocouple. From the measured temperature profile, a time point at which the temperature is at a peak is determined. And a time point at which the temperature is lowered to 98° C. is also determined. The temperature of 98° C. corresponds to the melting temperature of Sn—Bi—Pb alloy. An average cooling rate from the time point at which the temperature is in the peak to the time point at which the temperature lowered to 98° C. is obtained as the cooling rate. The temperature of 98° C. is lower enough compared with the melting point of the solder material, and thus it may be considered that the solder material is substantially solidified at the temperature of 98° C.

It is noted that the soldering process in the present invention can also be recognized as a process for producing the connecting structure in which the first member is soldered to the second member.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 2A shows the micrograph after the thermal treatment for 60 seconds, and FIG. 2B shows the micrograph after the thermal treatment for 180 seconds;

FIG. 3A shows the micrograph after the thermal treatment for 60 seconds, and FIG. 3B shows the micrograph after the thermal treatment for 180 seconds;

DETAILED DESCRIPTION OF THE INVENTION

First Embodiment

Figure 1:
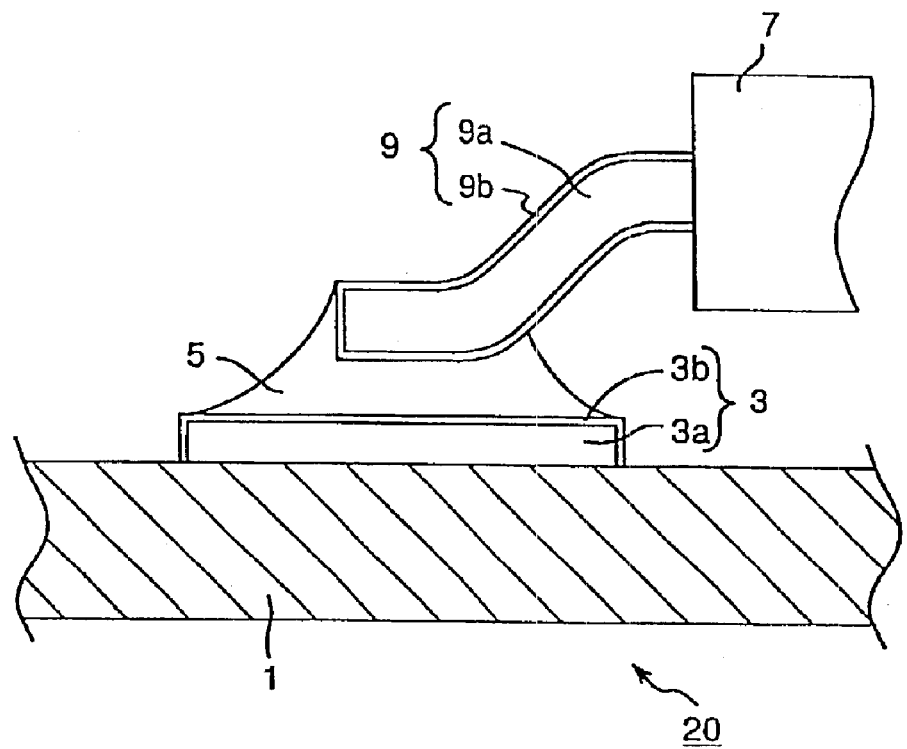
FIG. 1 shows a schematic partial cross section of an electronic circuit board produced by a soldering process in one embodiment of the present invention.

One embodiment of the present invention will hereinafter be described with reference to FIG. 1. The present embodiment relates to one embodiment in which both of a first member and a second member includes a barrier metal layer. FIG. 1 shows a schematic partial cross section of an electronic circuit board produced by a soldering process in the present embodiment.

First, a substrate 1 and an electronic component 7 to be connected to the substrate 1 are prepared. A land 3 is formed on the substrate 1. The land 3 includes a base material 3a made of Cu and a barrier metal layer 3b which consists of a single Ni layer and coats the base material 3a. The land 3 can be formed, for example, by the following procedure.

On an upper surface side of the substrate 1 made of, for example, glass epoxy resin, the base material 3a is formed integrally with a patterned wiring (not shown) by thermocompression bonding (or applying) of a copper foil followed by etching. The patterned wiring can have a width of about 50–100 μm, for example. After that, a resist is formed on a predetermined region of the surface side of the substrate 1 while covering the patterned wiring. At this stage, the base material 3a is not covered with the resist but is exposed. The height of the base material 3a (which is equal to the height of the patterned wiring) can be about 15–40 μm, for example.

The substrate 1 thus formed with the base material 3a, is immersed in an electrolytic solution in which Ni has been dissolved, and an appropriate voltage is applied to the base material 3a to precipitate Ni on the surface of the base material 3a. In this manner, an Ni layer as the barrier metal layer 3b is formed on the surface of the base material 3a by an electroplating method. The height of the Ni layer (which corresponds to the height of the barrier metal layer 3b in the present embodiment) can be, for example, about 2–5 μm. Thereby, it is possible to form the land 3 including the base material 3a and the barrier metal layer 3b (i.e. the Ni layer in the present embodiment) that coats the base material 3a, on the surface of the substrate 1. Seen from an upper surface side of the substrate 1, the land 3 can be in, for example, a rectangular shape having a lateral width of about 0.5–1.5 mm and a longitudinal width of about 0.5–1.5 mm. However, the present embodiment is not limited to this, and the land may be in any appropriate shape and size.

In the above description, the process for forming the Ni layer by the electroplating method was illustrated. In place of the above process, it is also possible to form an Ni layer coating the base material 3a: by a hot-dip plating method in which the substrate 1 formed with the base material 3a is dipped into a molten Ni material; by a displacement plating method in which such substrate 1 is dipped into a liquid containing a metal for plating and then the surface part of the base material 3a is displaced (or substituted) with the plating metal; or by a deposition method in which Ni is deposited onto the base material 3a. Those skilled in the art can conduct the electroplating method, the hot-dip plating method, the displacement plating method or the deposition method as described above while selecting appropriate conditions.

On the other hand, the electronic component 7 is provided with a lead 9. The lead 9 includes a base material 9a made of Cu and a barrier metal layer 9b which consists of a single Ni layer and coats the base material 9a. The lead 9 can be obtained beforehand by forming the Ni layer as the barrier metal layer on the surface of the base material 9a in the same manner as above. The electronic component 7 having this lead 9 is prepared.

A cream solder is applied on the land 3 of the substrate 1 thus prepared, for example, by a screen printing method, a dispensing method or the like. This cream solder consists of a flux and metal particles (or soldering powder) dispersed in the flux. The metal particles are made of a solder material containing Sn and Bi such as an Sn—Ag—Bi based material, more specifically Sn-3Ag-2.5Bi-2.5In material or Sn-3.5Ag-0.5Bi-3In material. As the flux, a commercially available flux including rosin, an activator and a solvent can be used. The metal particles can have an average diameter of, for example, about 20–40 μm, and can be present in the cream solder at a ratio of about 85–90% by weight on the basis of the total weight of the cream solder.

Thereafter, the electronic component 7 is appropriately placed on the substrate 1 so that the lead 9 of the electronic component 7 contacts the cream solder applied on the land 3. In this stage, the cream solder contacts the barrier metal layer 9b of the lead 9 and the barrier metal layer 3b of the land 3, and does not contact the base materials 9a and 3a. Thus resultant substrate 1 is subjected to a heat treatment by passing through a heated atmosphere at a temperature of for example, about 215–240° C., preferably about 220–230° C. As a result, an amount of heat is supplied to the cream solder to melt the solder material (the Sn—Ag—Bi based material in the present embodiment) of the metal particles in the cream solder, while components other than the metal particles, such as the flux, are evaporated (or volatilized) to be removed.

During the heat treatment, since Ni constituting the barrier metal layers 3b and 9b hardly melts and diffuses in the molten solder material although the molten solder material contacts the barrier metal layers 3b and 9b, the molten solder material does not directly contact the base materials 3a and 9a. Therefore, the formation of an intermetallic compound of Sn—Cu is prevented, and therefore the formation of a concentrated Bi layer does not occur.

Then, following the heat treatment, the substrate 1 is cooled (or subjected to radiational cooling) to solidify the molten solder material, whereby a connecting part (a soldering part) 5 substantially made of the solder material is formed. By this connecting part 5, the lead 9 of the electronic component 7 is electrically and mechanically connected (soldered) to the land 3 of the substrate 1. In the present embodiment, the cooling rate of the solder material on cooling the substrate may be at a level as in the conventional soldering process.

As described above, there is produced an electronic circuit board 20 wherein the electronic component 7 is mounted on the substrate 1. As to both of an interface (or a connection interface) between the lead 9 of the electronic component 7 and the connecting part 5, and an interface (or a connection interface) between the land 3 of the substrate 1 and the connecting part 5 in the produced electronic circuit board 20, the formation of the intermetallic compound of Sn—Cu is prevented. Furthermore, the formation of the concentrated Bi layer is substantially suppressed.

Figure 2A:
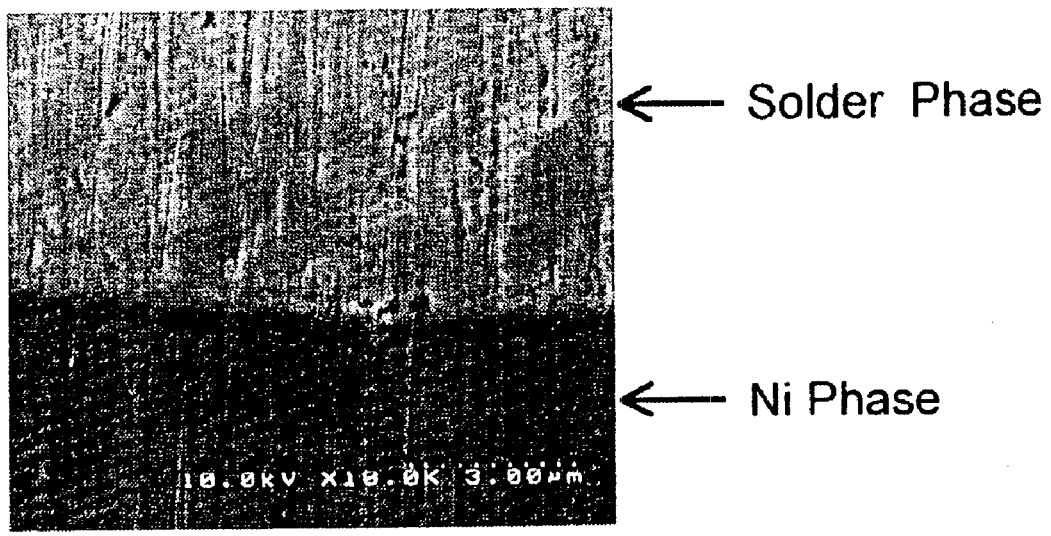
FIGS. 2A and 2B show a scanning electron micrograph of a cross sectional part including an interface between a barrier metal layer (Ni Phase) of a land and a connecting part (Solder Phase) after subjecting an electronic circuit board in one embodiment of the present invention to a heat treatment under a temperature of about 180° C.
Figure 2B:
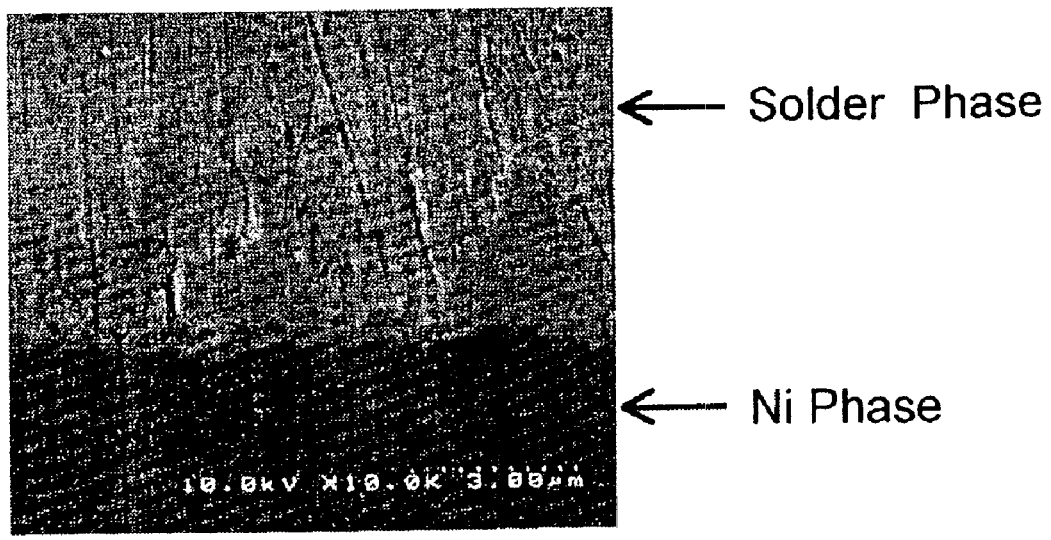

As described above, an electronic circuit board was produced a, and subjected to the heat treatment under a temperature of about 180° C. FIGS. 2A and 2B show a scanning electron micrograph (SEM) of a cross sectional part including the interface between the barrier metal layer (Ni Phase) of a land and a connecting part (Solder Phase) substantially made of the solder material after this heat treatment. FIG. 2A shows the micrograph after the thermal treatment for 60 seconds, and FIG. 2B shows the micrograph after the thermal treatment for 180 seconds. As is apparent from FIGS. 2A and 2B, the solder phase had a uniform composition in the vicinity of the Ni phase in both cases of the heat treatments for 60 seconds and 180 seconds.

Figure 3A:
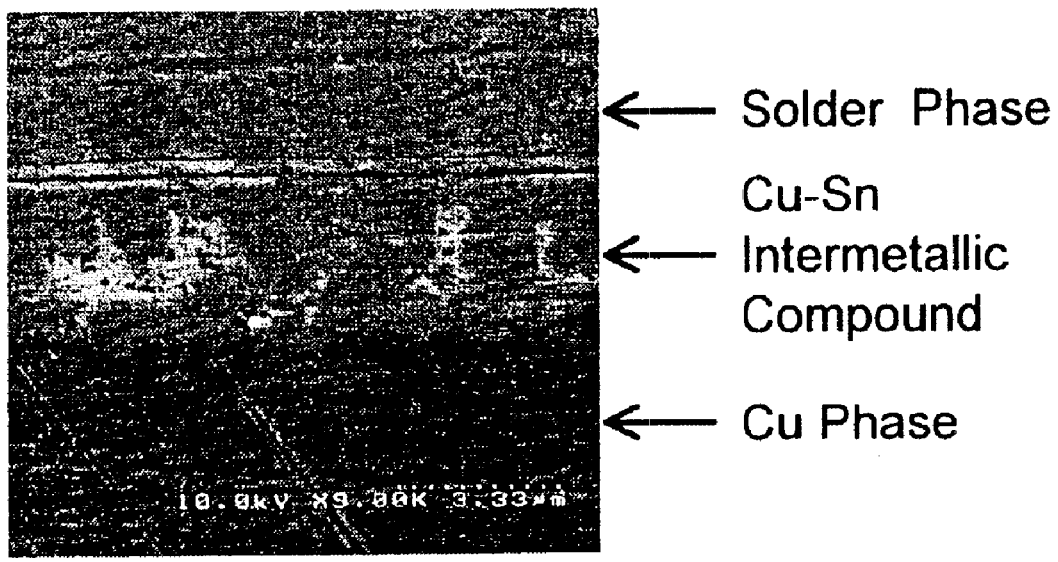
FIGS. 3A and 3B show a scanning electron micrograph in a cross section including an interface between a land (Cu Phase) and a connecting part (Solder Phase) after subjecting an electronic circuit board of a comparative example to a heat treatment under a temperature of about 180° C.
Figure 3B:
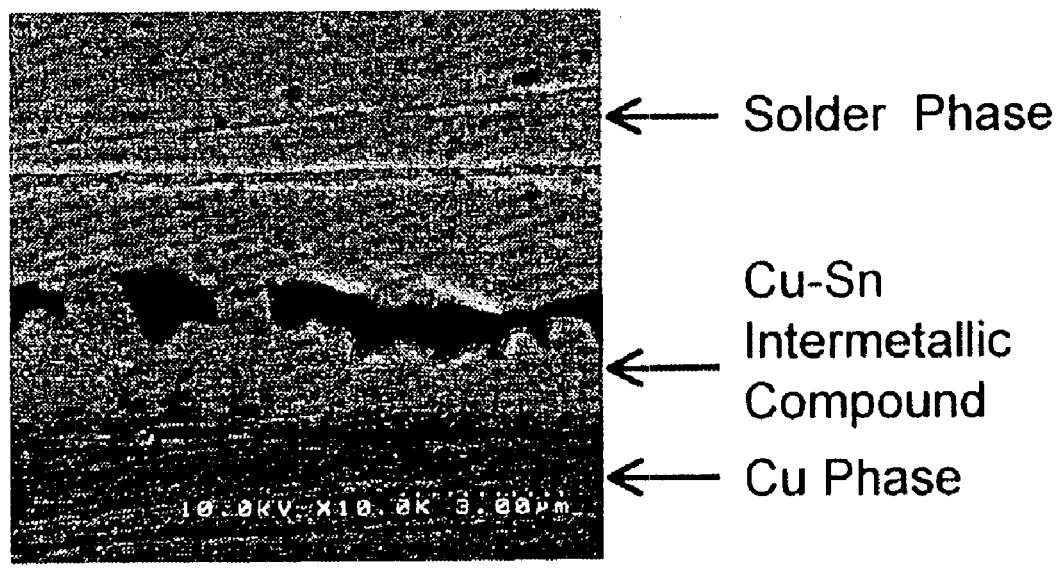

Contrary to this, as a comparative example of the present embodiment, an electronic circuit board was produced in the same manner as in the present embodiment, except that no barrier metal layer 3b of a land 3 was formed (that is, the land 3 was constituted only of a base material 3a of Cu), and that a base material 9a of an electronic component was coated with an Sn—Pb plating in place of the barrier metal layer 9b of the lead 9. Thus produced electronic circuit board was subjected to the heat treatment under a temperature of about 180° C. FIGS. 3A and 3B show a scanning electron micrograph (SEM) of a cross sectional portion in the vicinity of an interface between a land (Cu Phase) and a connecting part (Solder Phase) substantially made of a solder material after the heat treatment. FIGS. 3A and 3B show a micrograph after the heat treatment for 60 seconds and for 180 seconds respectively which correspond to FIGS. 2A and 2B respectively. As shown in FIG. 3A, an intermetallic compound of Cu—Sn was formed between the Cu phase and the solder phase, and an Sn—Bi—Pb alloy (which is shown in drawings as white areas in the vicinity of the Cu—Sn intermetallic compound) is segregated around the Sn—Bi—Pb alloy. This Sn—Bi—Pb alloy has a low melting point of about 100° C., and is thus presumed to be in a molten state during the heat treatment. As proceeding with the heat treatment, voids were formed at the Sn—Bi—Pb alloy formed around the Cu—Sn intermetallic compound as shown in FIG. 3(b) (which voids is shown in drawings as black areas between the Cu—Sn intermetallic compound and the solder phase). For this reason, the connection strength of the connecting part is presumed to be lowered.

Although the barrier metal layer is in the form of the single Ni layer in the present embodiment, the present invention is not limited to this. A barrier metal layer in the form of a multilayer laminate may be provided while forming other layer(s) such as an Au layer, above the Ni layer in such a manner as the formation of the Ni layer. Other layer(s) such as the Au layer locating above the Ni layer is formed with a thickness of about 0.01–0.1 $\mu$m per layer.

Although both the base materials of the land and the lead are made of Cu and are coated with the barrier metal layer in the present embodiment, the present invention is not limited to this. At least one of the base materials can contain Cu, and the one base material containing Cu can be coated with the barrier metal layer. For example, in the case where the base material of the lead is made of an Fe-42Ni alloy material containing no Cu, this base material is not necessarily coated with the barrier metal layer. The base material in such case may be coated with a plating made of, for example, an Sn—Pb based material.

Particularly in a case where the base material of the lead is plated with the Sn—Pb based material, since the base material of the land is made of Cu and still coated with the barrier metal layer, an intermetallic compound of Sn—Cu is not formed at the interface between the land and the connecting part, and thus a concentrated Bi phase is not enlarged or preferably is not substantially formed. Therefore, even though Pb contained in the plating of the lead elutes into the connecting part, the formation of an Sn—Bi—Pb alloy can effectively be reduced.

Although the Sn—Ag—Bi based material is used as the solder material containing Sn and Bi in the present embodiment, the present invention is not limited to this. When a material other than the Sn—Ag—Bi based material, such as an Sn—Bi based material is used, similar effects to this embodiment can be obtained.

Furthermore, in the present embodiment, the electronic component is soldered (or connected) to the substrate by the reflow soldering process, but the present invention is not limited to this. A substrate and an electronic component prepared in the same manner as in the present embodiment may be soldered to each other by, for example, a flow soldering process.

Second Embodiment

Next, another embodiment of the present invention will be described. The present embodiment relates to one embodiment in which the cooling rate of a solder material is higher than the conventional cooling rate, although both of a first member and a second member do not include a barrier metal layer.

In the present embodiment, a lead of an electronic component is soldered to a land of a substrate with an Sn—Ag—

Bi based material which is a solder material containing Sn and Bi, by means of a reflow furnace used for a general reflow soldering. As the electronic component, for example, a general electronic component can be used of which lead includes a base material of Cu plated with Sn—Pb. As the land of the substrate, a land of Cu can be used (which does not include a barrier metal layer).

Figure 4:
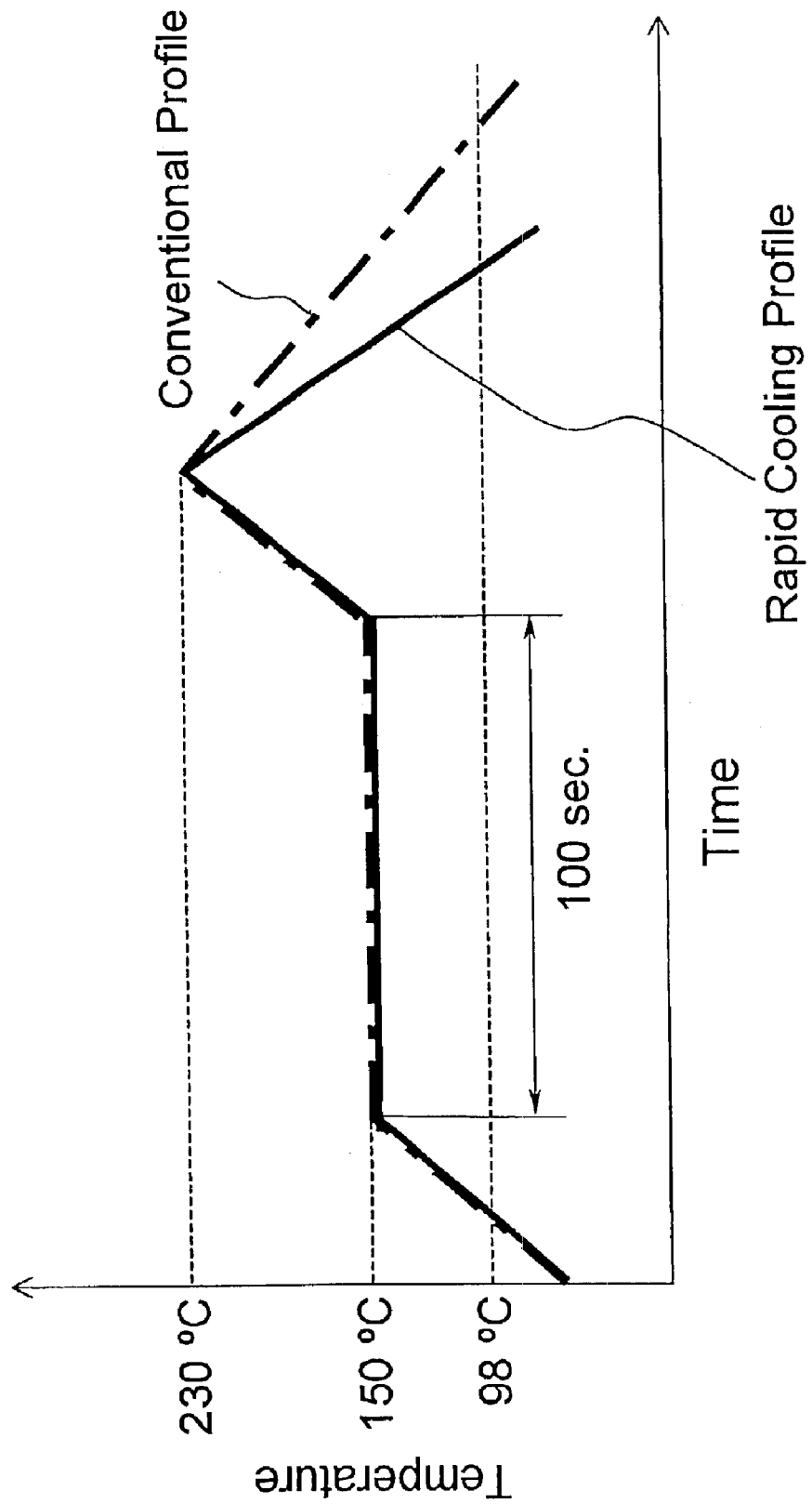
FIG. 4 shows a temperature profile at a connecting part of a solder material in the present embodiment together with a temperature profile of the comparative example.
Figure 5:
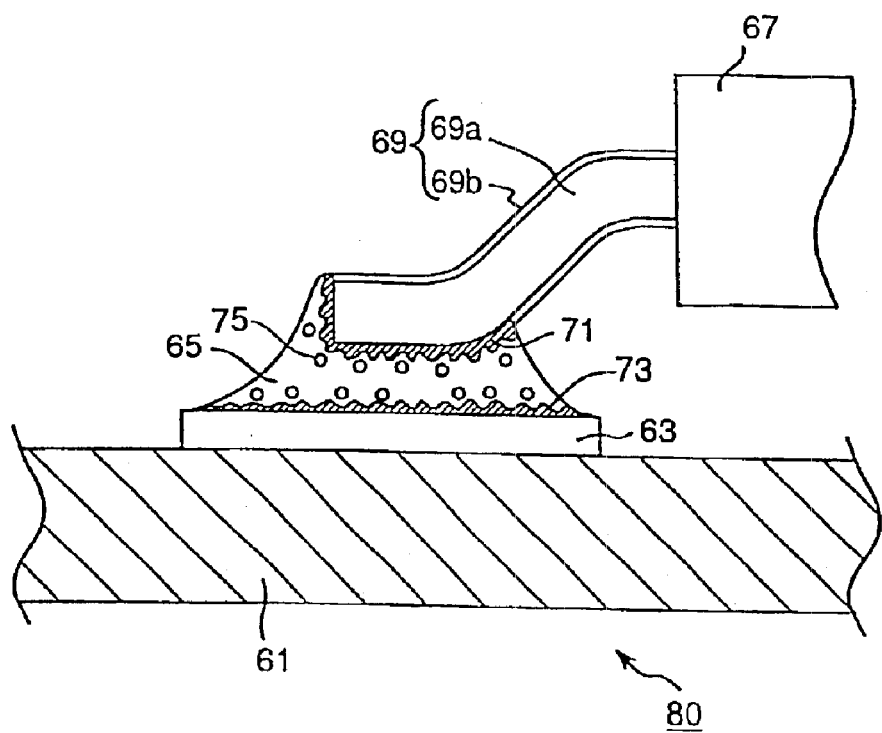
FIG. 5 shows a schematic partial cross section of an electronic circuit board produced by the conventional soldering process.

A soldering process in the present embodiment is different from the conventional soldering process in that, after the solder material melts during the heat treatment of reflow, the substrate (in more detail, the molten solder material) is positively cooled. Specifically, a cream solder containing a solder material in the form of soldering powder is applied onto the land of the substrate by, for example, screen printing. The electronic component is appropriately placed on the substrate so that the lead of the electronic component is located on the land through the solder material. Thus obtained substrate is put in a reflow furnace and then treated with heat. A temperature profile in this case (Rapid Cooling Profile) is shown with a solid line in FIG. 4. As shown in FIG. 4, the temperature of the land is first elevated to about 150° C., maintained at this temperature for about 100 seconds, and then elevated again to reach a peak temperature of about 230° C. During this heat treatment, the solder material (soldering powder) in the cream solder applied onto the land melt, while other components such as a flux in the cream solder are evaporated (or volatilized) to be removed. After that, in the present embodiment, the substrate is rapidly cooled so as to cool the solder material by supplying nitrogen gas at a normal temperature to an inside of the reflow furnace at a flow rate of about 200–500 liter/min while, for example, adjusting the flow rate of the gas so as to obtain a desired temperature profile. The temperature of the land is lowered to 98° C. before long. Thereby, the solder material on the land solidifies to form a connecting part, and the lead of the electronic component is soldered to the land of the substrate. In the reflow soldering process of the present embodiment, an average cooling rate from the time point at which the temperature of the land has reached the peak temperature (about 230° C. in the present embodiment) to the time point at which the temperature has been lowered to 98° C. (which corresponds to the melting point of an Sn—Bi—Pb alloy) can be, for example, at least about 10° C./sec, preferably at least about 20–30° C./sec.

As described above, there is produced an electronic circuit board wherein the electronic component is mounted on the substrate. In both of an interface between the lead of the electronic component and the connecting part, and an interface between the land of the substrate and the connecting part in the produced electronic circuit board, the formation of the intermetallic compound can be prevented, and the formation of the concentrated Bi layer can also substantially be suppressed.

Contrary to this, a temperature profile of the land in a conventional reflow soldering process (Conventional Profile) wherein cooling is not rapid, is also shown with a dashed line in FIG. 4. In the conventional reflow soldering process, the cooling is not positively performed. Although there is a case in which air at about normal temperature is allowed to flow in the reflow furnace, its flow rate is only about 50–100 liter/min. In such conventional reflow soldering process, an average flow rate from the time point at which the temperature of the land has reached the peak temperature (about 230° C.) to the time point at which the temperature has been lowered to 98° C. (which corresponds to the melting point of an Sn—Bi—Pb alloy) is only about 5° C./sec, and not larger than 10° C./sec at most. As to the electronic circuit board on which the electronic component is mounted by the conventional reflow soldering process, in both of an interface between the lead of the electronic component and the connecting part, and an interface between the land of the substrate and the connecting part, the formation of the intermetallic compound of Sn—Cu cannot be prevented, resulting in an enlargement of a concentrated Bi layer. For that reason, a sufficient thermal fatigue strength cannot be obtained. Particularly in a case where an Sn—Pb plated lead is soldered to the land of the substrate, the formation of an Sn—Bi—Pb alloy occurs, which can result in the remarkable degradation of the connecting part.

In the present embodiment, for the purpose of cooling the molten solder material at a cooling rate of at least 10° C./sec to solidify, a gas cooling with nitrogen gas is used as a cooling means. However, the present invention is not limited to this, and any appropriate means may be used. For example, the solder material may be cooled, for example, by allowing air or the like having an appropriate temperature to flow at a sufficient flowing rate into the reflow furnace, for example, against the whole of the substrate or against the solder material by using a fan or a nozzle. Alternatively, the solder material may be cooled by spraying droplets in the form of mist against the substrate, or by dipping the whole of the substrate in a liquid (e.g. water) having an appropriate temperature.

Although the Sn—Ag—Bi based material is used as the solder material containing Sn and Bi in the present embodiment, the present invention is not limited to this. When other materials than the Sn—Ag—Bi based material, such as an Sn—Bi based material is used, similar effects to this embodiment can be obtained.

Furthermore, although the reflow soldering process is described in the present embodiment, the feature of the present embodiment of positively cooling the soldering part at a cooling rate of at least 10° C./min can also be applied to a flow soldering process (or a wave soldering process), and similar effects to this embodiment can also be attained in such a case.

As described above, the two embodiments of the present invention are described, but the present invention is not limited to them, and it will be readily understood by those skilled in the art that various modifications can be made unless they deviate from the concept of the present invention.

What is claimed is:

1. A method of soldering comprising:
   supplying a solder material between a first member and a second member, the solder including Sn and Bi, one of the first member and the second member comprising a base material including Cu and comprising a barrier metal layer coating the base material, the other of the first member and the second member having a surface made of a material comprising lead;
   contacting the solder material with the barrier metal layer and with the surface made of the material comprising lead while the solder material is in a molten state; and
   solidifying the solder material, whereby soldering between the first member and the second member is conducted.

2. A method of soldering comprising:
   supplying a solder material between a first member and a second member, the solder material including Sn and Bi, at least one of the first member and the second member comprising a base material including Cu and comprising a barrier metal layer coating the base material, the barrier metal layer comprising an Ni layer and an Sn—Bi layer above the Ni layer;

contacting the solder material with the barrier metal layer while the solder material is in a molten state; and solidifying the solder material, whereby soldering between the first member and the second member is conducted.

3. The method of claim 2, wherein one of the first member and the second member comprises the barrier metal layer, the other of the first member and the second member having a surface made of a material comprising lead, said contacting comprising contacting the solder material with the barrier metal layer and with the surface made of the material comprising lead while the solder material is in a molten state.

4. The method of claim 2, wherein the barrier metal layer further comprises at least one layer additional located above the Ni layer and selected from the group consisting of an Au layer and a Pd layer.

5. The method of claim 2, wherein the first member is an electrode formed on a substrate, and the second member is an electrode of an electronic component.

6. The method of claim 2, wherein said supplying of the solder material, said contacting of the solder material, and said solidifying of the solder material are conducted in a flow soldering process manner or a reflow soldering process manner.

7. The method of claim 2, wherein the barrier metal layer consists of the Ni layer and the Sn—Bi layer above the Ni layer.

8. The method of claim 2, wherein the barrier metal layer comprises the Ni layer and the Sn—Bi layer above and directly contacting the Ni layer.

9. The method of claim 2, wherein said contacting of the solder material with the barrier metal layer comprises contacting the solder material with the barrier metal layer while the solder material is in a molten state so that the first contact between the barrier metal layer and the solder material occurs when the solder material is in a molten state.

10. The method of claim 2, further comprising forming the barrier metal layer on the base material of at least one of the first member and the second member by a process selected from a group consisting of electroplating, hot-dip plating, displacement plating, and deposition.

11. A method of improving a thermal fatigue strength of a soldering part, comprising:

supplying a solder material including Sn and Bi between a first member and a second member, at least one of the first member and the second member having a portion including Cu;

coating a surface of the portion with a barrier metal layer, the barrier metal layer comprising an Ni layer and an Sn—Bi layer above the Ni layer;

contacting the solder material with the barrier metal layer while the solder material is in a molten state; and solidifying the solder material to form a soldering part of the solder material between the first member and the second member, whereby the thermal fatigue strength of the soldering part is improved.

12. The method of claim 11, wherein one of the first member and the second member has the portion including Cu coated with the barrier metal layer, the other of the first member and the second member having a surface made of a material comprising lead, said contacting comprising contacting the solder material with the barrier metal layer and with the surface made of the material comprising lead while the solder material is in a molten state.

13. The method of claim 11, wherein the barrier metal layer further comprises at least one layer additional located above the Ni layer and selected from the group consisting of an Au layer and a Pd layer.

14. The method of claim 11, wherein the first member is an electrode formed on a substrate, and the second member is an electrode of an electronic component.

15. The method of claim 11, wherein said supplying of the solder material, said contacting of the solder material, and said solidifying of the solder material are conducted in a flow soldering process manner or a reflow soldering process manner.

16. The method of claim 11, wherein the barrier metal layer consists of the Ni layer and the Sn—Bi layer above the Ni layer.

17. The method of claim 11, wherein the barrier metal layer comprises the Ni layer and the Sn—Bi layer above and directly contacting the Ni layer.

18. The method of claim 11, wherein said contacting of the solder material with the barrier metal layer comprising contacting the solder material with the barrier metal layer while the solder material is in a motel state so that the first contact between the barrier metal layer and the solder material occurs when the solder material is in a molten state.

19. The method of claim 11, wherein said coating of the surface of the portion comprises forming the barrier metal layer on the portion of at least one of first member and the second member by a process selected from a group consisting of electroplating hot-dip plating, displacement plating, and deposition.

* * * * *

UNITED STATES PATENT AND TRADEMARK OFFICE
CERTIFICATE OF CORRECTION

PATENT NO. : 6,871,775 B2
DATED : March 29, 2005
INVENTOR(S) : Atsushi Yamaguchi et al.

It is certified that error appears in the above-identified patent and that said Letters Patent is hereby corrected as shown below:

<u>Column 18,</u>
Line 38, please replace "motel" with -- molten --.
Line 46, please add a comma in between "electroplating" and "hot-dip".

Signed and Sealed this

Ninth Day of August, 2005

JON W. DUDAS
*Director of the United States Patent and Trademark Office*